(12) United States Patent
Hao et al.

(10) Patent No.: US 6,174,776 B1
(45) Date of Patent: Jan. 16, 2001

(54) METHOD FOR FORMING GATE CONTACT IN COMPLEMENTARY METAL OXIDE SEMICONDUCTOR

(75) Inventors: Ching-Chiao Hao, Hsin-Chu; Chih-Yuan Hsiao, Feng-Shan; Hua-Chou Tseng, Hsin-Chu, all of (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/425,604

(22) Filed: Oct. 22, 1999

(51) Int. Cl.⁷ .................................................. H01L 21/336
(52) U.S. Cl. .......................... 438/286; 438/303; 438/595; 438/597
(58) Field of Search ..................................... 438/197, 286, 438/299, 303, 595, 597, 301

(56) References Cited

U.S. PATENT DOCUMENTS

| | | | |
|---|---|---|---|
| 5,320,974 | * | 6/1994 | Hori et al. . |
| 5,399,526 | * | 3/1995 | Sumi . |
| 5,547,888 | * | 8/1996 | Yamazaki . |
| 6,004,849 | * | 12/1999 | Gardner et al. ..................... 438/286 |
| 6,004,852 | * | 12/1999 | Yeh et al. . |
| 6,017,823 | * | 1/2000 | Shishiguchi et al. ............... 438/696 |

* cited by examiner

Primary Examiner—Long Pham
(74) Attorney, Agent, or Firm—Harness, Dickey & Pierce, P.L.C.

(57) ABSTRACT

A method for forming a gate contact is disclosed. The method includes that a semiconductor substrate and a silicon dioxide layer are provided upon the semiconductor substrate. Then, a polysilicon layer is formed upon the oxide layer. Next, defining and etching the polysilicon layer are carried out to form a gate. Implanting upon the top surface of the silicon dioxide layer is achieved so that source/drain region is formed below and abuts the silicon dioxide layer. The source/drain region will be annealed. A spacer can be formed and abuts the sidewall of the gate. A salicide is formed and overlaps the top surface of the gate and over the semiconductor substrate. Then, a gate contact area can be defined upon the top surface of the semiconductor substrate by using a mask that has a pattern covering approximately half of the gate and the spacer. The half of the spacer can be removed without covering by the mask. Finally, implanting will be completed to form the gate contact in the substrate by using the salicide as an implanting mask.

10 Claims, 7 Drawing Sheets

METHOD FOR FORMING GATE CONTACT IN COMPLEMENTARY METAL OXIDE SEMICONDUCTOR

BACKGROUND OF THE INVENTION

1. Field of the Invention

The invention relates to forming a complementary metal oxide semiconductor, more particularly to the production of a gate contact in the complementary metal oxide semiconductor.

2. Description of the Prior Art

Generally, gate contact metal oxide semiconductor (GCMOS) will have gate contact (GC) implantation by the zero degree angle into source site only. In the fabrication process, when the polysilicon layer becomes narrower, the implant will be very aligned. Therefore, the operation for the overlay rule of GC implanting to the source region of the active area will become the major issue of the above fabrication process.

In the conventional method, and referring to FIG. 1A, firstly a semiconductor substrate 10 with an oxide layer 11 upon the semiconductor substrate 10 is provided. Again, as in FIG. 1A, defining polysilicon 12 as gate 12 is carried out.

Sequentially, as FIG. 1B, photoresist mask 13 is formed on top surface of oxide layer 11 and it can cover half of gate 12. Gate contact implanting is achieved as a poor overlay region 14, about 0.09 $\mu$m.

Then, as shown in FIG. 1C, source/drain is implanted as regions 15A and 15B. Then, annealing can be completed soon by using rapid thermal processing (RTP) at 1000° C.

Then, as shown in FIG. 1D, silicon nitride 16 is deposited and etched as spacer 16 upon top surface of oxide layer 11.

Finally, as shown in FIG. 1E, salicide can be formed as salicilide zone 17 on top surface of gate 12 and top surface of oxide layer 11 by using rapid heating processing.

Normally, the development of quarter-micrometer CMOS devices requires so-called substrate engineering as well as drain engineering. The formation of the bulk doping profile is one of the most important technologies in the quarter-micrometer range.

However, obviously, the constructed structure of the semiconductor device by the above progress does not satisfy the requirement of the next generation. Therefore, it is necessary to develop another fabrication process in the field of the smaller size in the semiconductor industry, such as 0.18 $\mu$m.

SUMMARY OF THE INVENTION

In accordance with the present invention, a method is provided for forming gate contact in the CMOS that substantially can precisely controlling the shape and area of the CMOS.

In one embodiment, a semiconductor substrate and a silicon dioxide layer are provided upon the semiconductor substrate. Then, a polysilicon layer is formed upon the oxide layer. Next, defining and etching the polysilicon layer are carried out to form a gate. Implanting upon the top surface of the silicon dioxide layer are achieved so that source/drain region is formed below and abuts the silicon dioxide layer. The source/drain region will be annealed. A spacer can be formed and abut the sidewall of the gate. A salicide is formed and overlapped upon the top surface of the gate and over the semiconductor substrate. Then, a gate contact area can be defined upon the top surface of the semiconductor substrate by using a mask that has a pattern covering approximately the half of the gate and the spacer. The half of the spacer can be removed without being covered by the mask. Finally, implanting will be completed to form gate contact in the substrate by using the salicide as an implanting mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Moreover, while the present invention is illustrated by a number of preferred embodiments directed to gate contact for the complementary metal oxide semiconductor (CMOS), it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

The spirit of the proposed invention can be explained and understood by the following embodiments with corresponding figures. It will briefly be noted here that there is a substrate in FIGS. 2A to 2G.

Figure 1A:
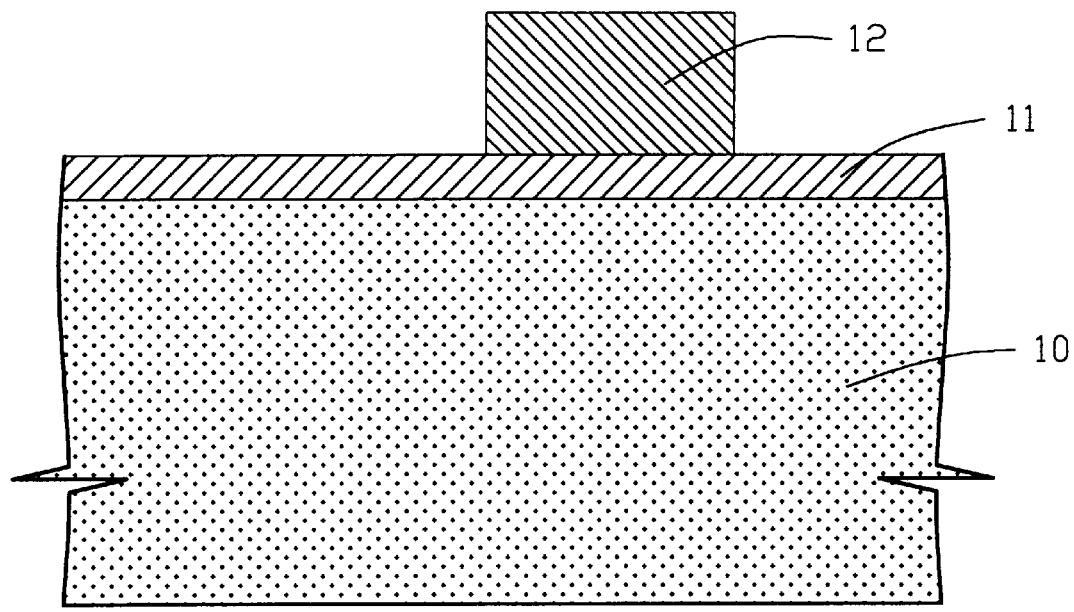
FIGS. 1A to 1E are process diagrams schematically illustrating a conventional art.
Figure 1B:
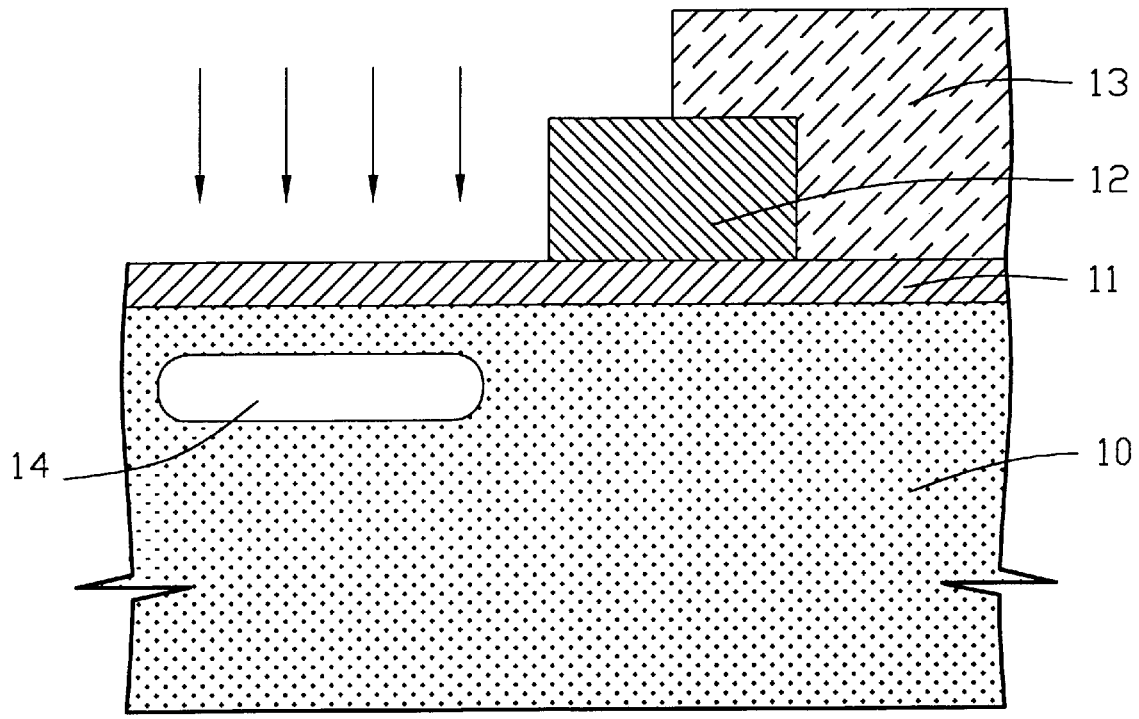
Figure 1C:
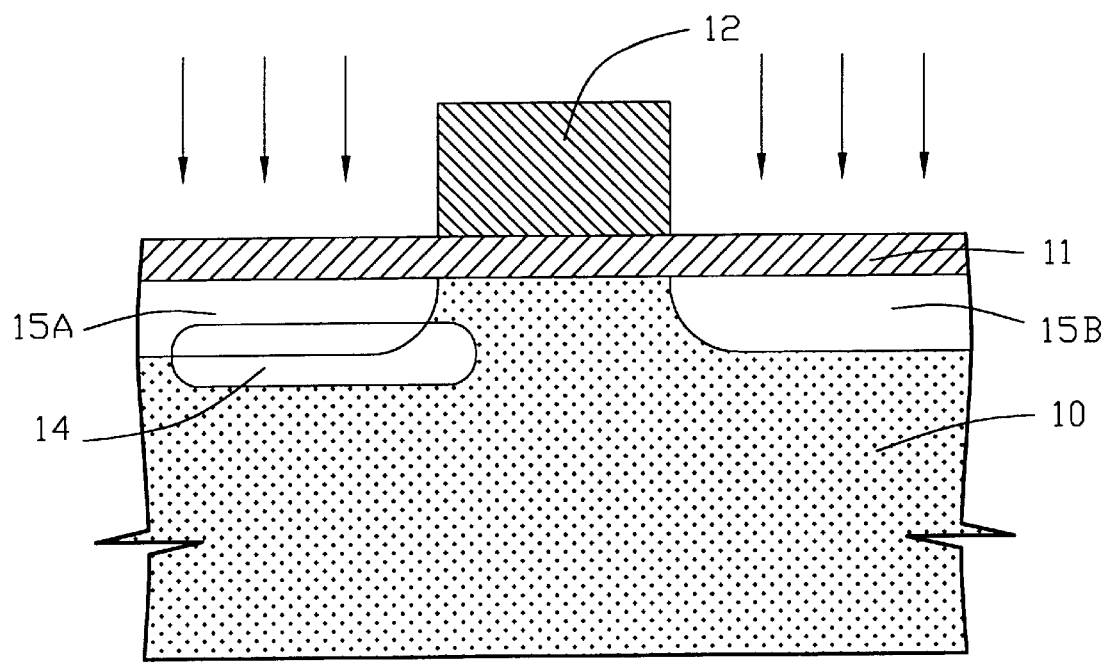
Figure 1D:
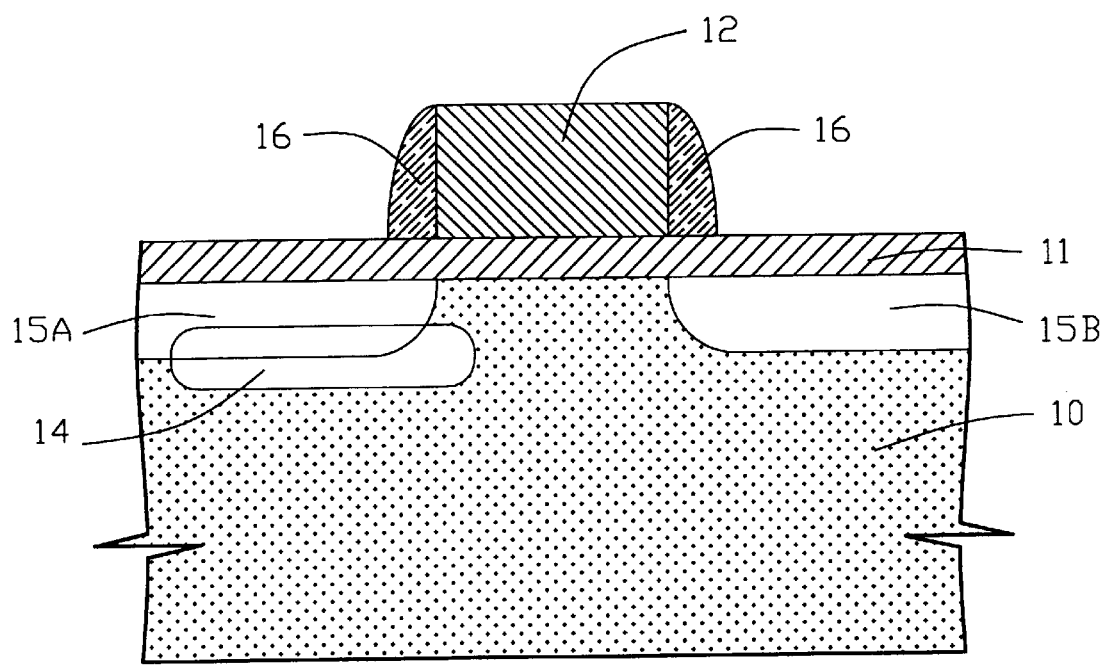
Figure 1E:
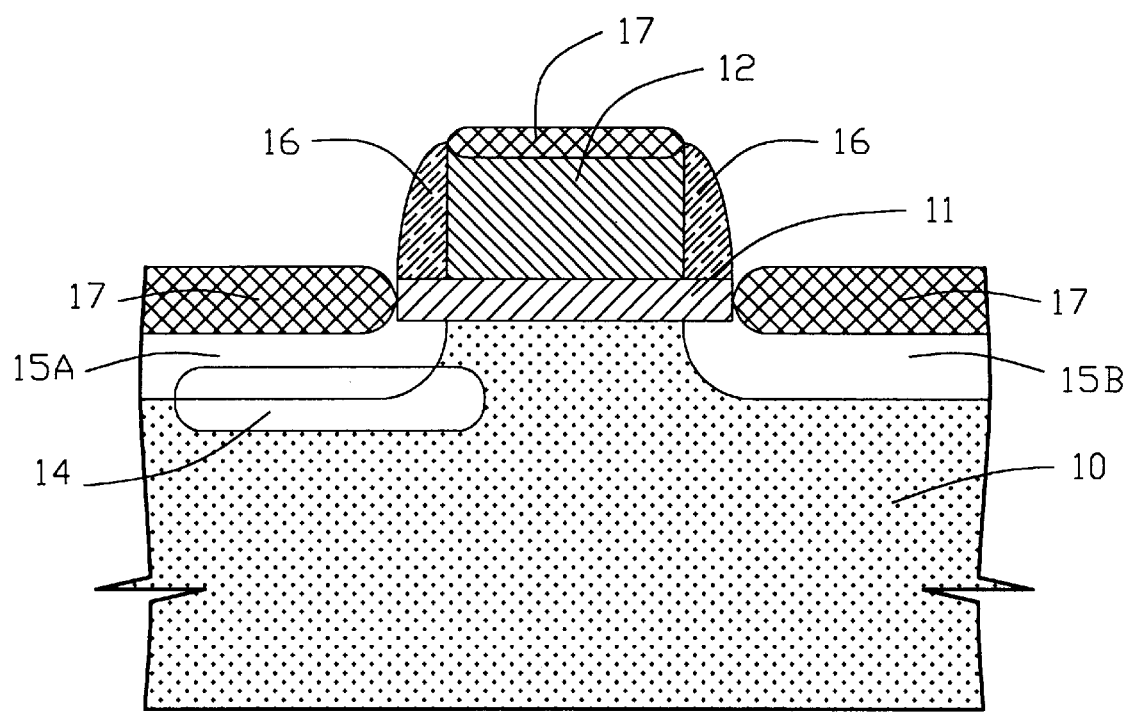
Figure 2A:
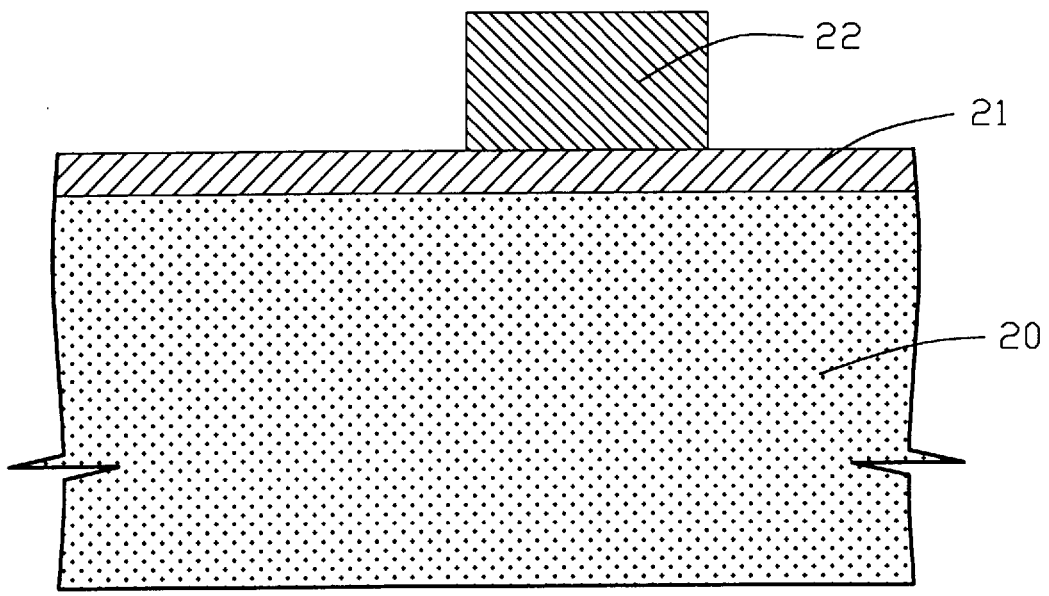
FIGS. 2A to 2G are circuit diagrams schematically illustrating an embodiment of the present invention.

Firstly, as shown in FIG. 2A, a semiconductor substrate 20 and an silicon dioxide layer 21 upon the semiconductor substrate 20 can be provided. Normally, a polysilicon layer 22 is formed upon the silicon dioxide layer 21 using conventional deposition techiques. The thickness of this polysilicon layer 22 is about 1000 $\mu$m. Then polysilicon layer 22 can be defined and etched as a gate 22 using conventional lithography.

Figure 2B:
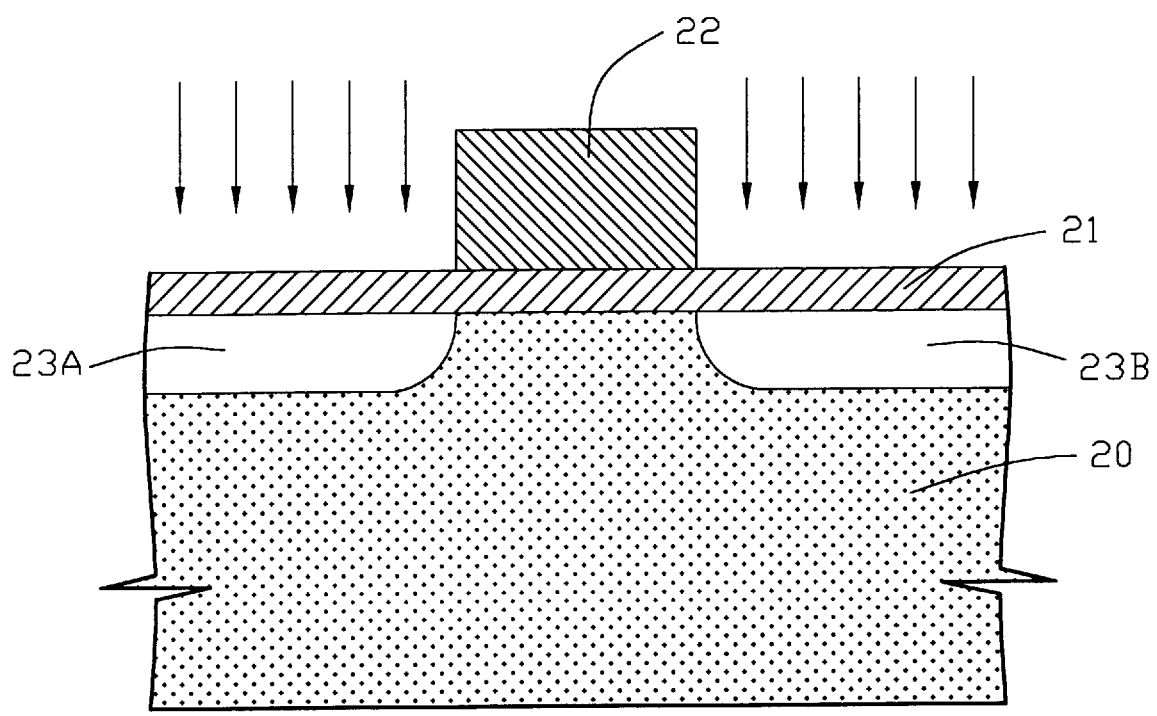

With reference to FIG. 2B, using conventional implantation, source/drain regions 23A and 23B will be formed below and abut the top surface of the oxide layer. Consequentially, treat annealing is undertaken to the source/drain region in order to extend much more area by heating to 700° C. to 1000° C. in the tube furnace.

Figure 2C:
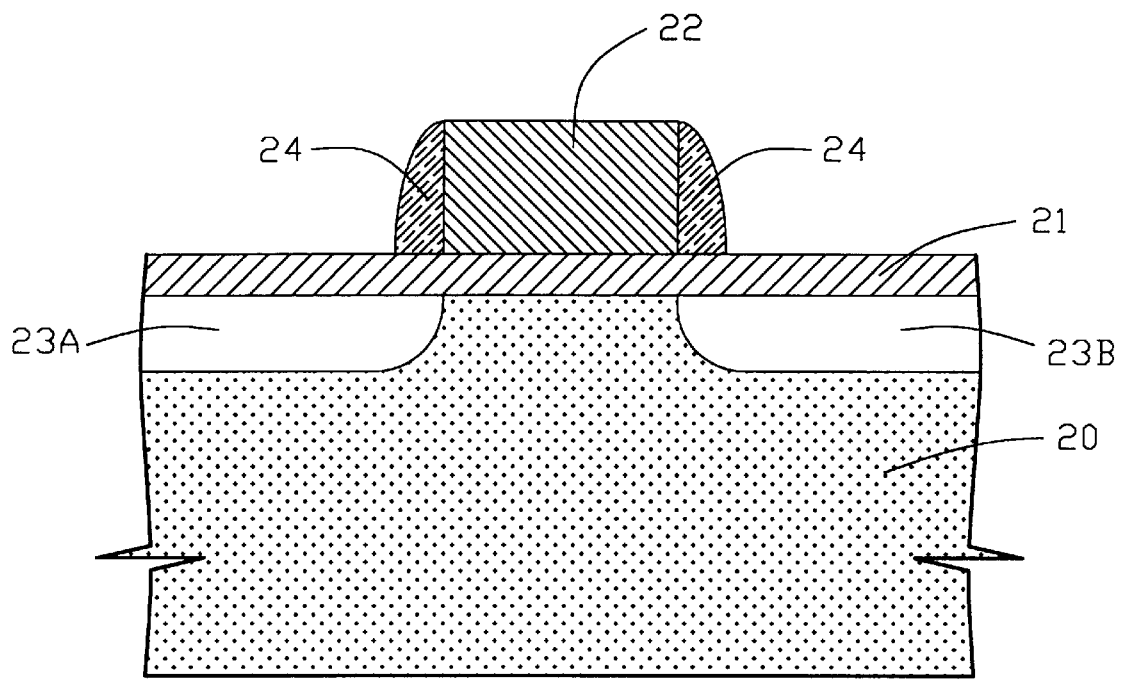

FIG. 2C shows that a silicon nitride layer 24 is deposited upon the top surface of the semiconductor substrate 20 as spacer layer 24 using conventional deposition techniques. Here, the thickness of this layer is about 1000 angstroms. Then, spacer 24 is defined using conventional lithography and etching techniques and also abuts gate 22.

Figure 2D:
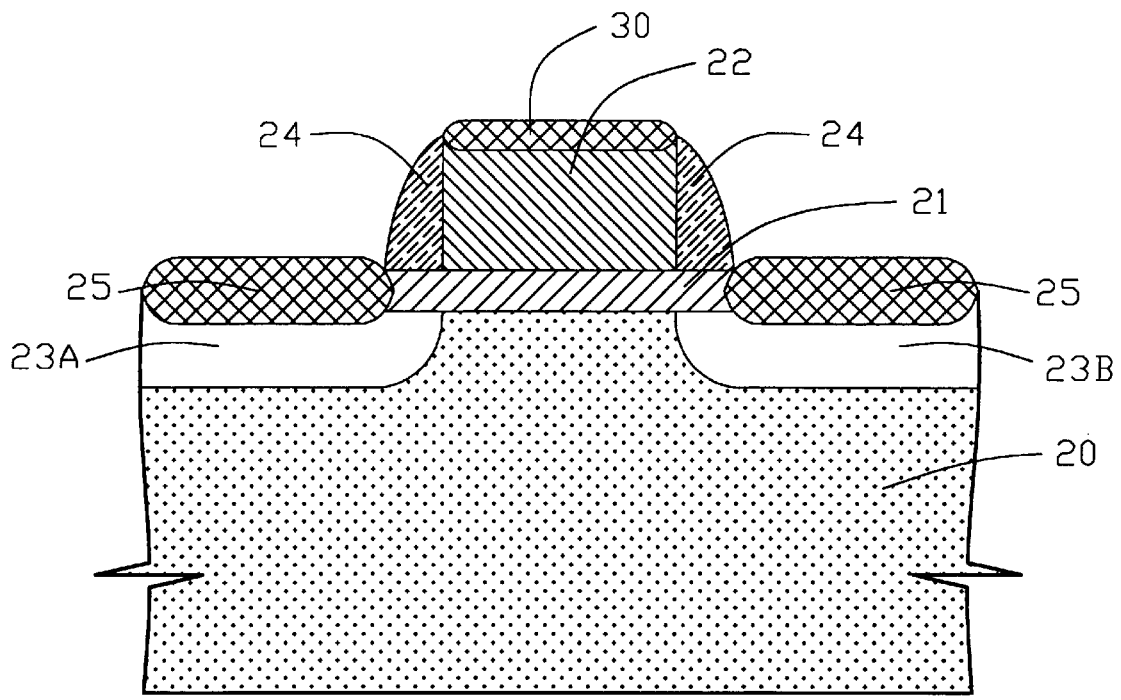

As shown in FIG. 2D, salicide could be formed and overlapped by the conventional deposition over gate 22 and the semiconductor substrate 20 such as salicide region 25 and salicide region 30. Then, rapid heat processing can be carried out and the temperature can be controlled at 700° C. to 1000° C. The time for this step is about 15 seconds.

Figure 2E:
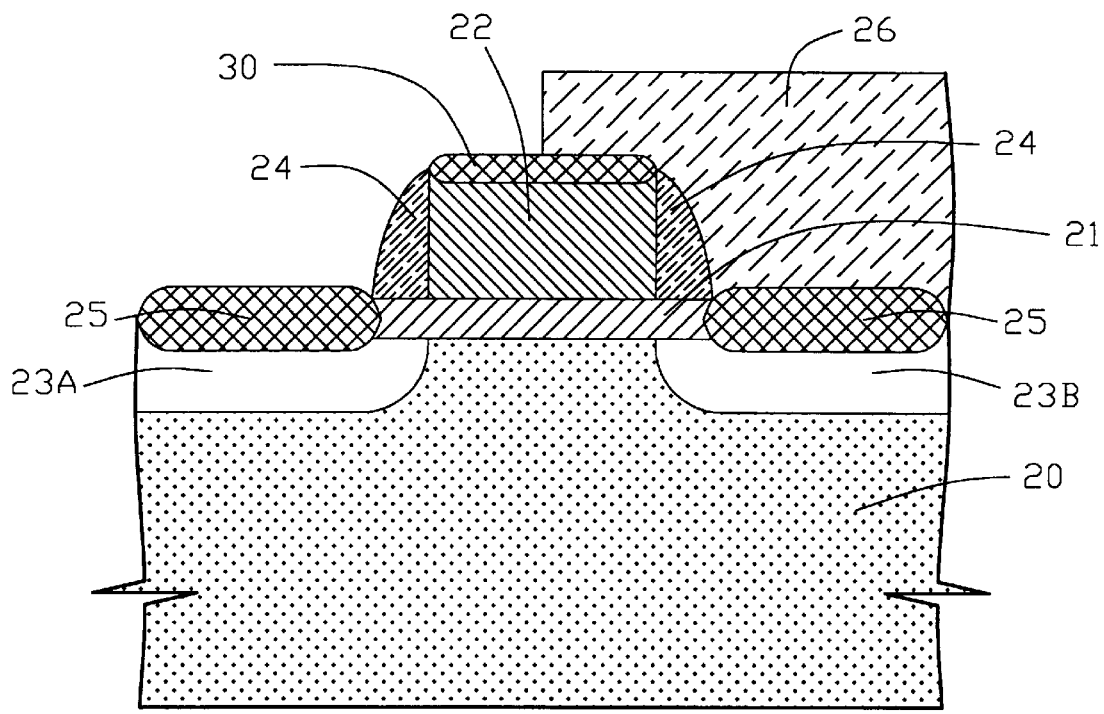

It is shown in FIG. 2E that gate contact area will be defined upon top surface of the semiconductor substrate 20 by using photoresist mask 26 that has a pattern covering approximately half of the gate and the spacer. The total distance is overlapped about 0.16 μm due to the evacuated distance of gate contact about 0.09 μm plus the distance of spacer (0.07 μm). The gate contact area is in one side only, alternately. This means that the gate contact area can be on the right side or left side of the gate.

Figure 2F:
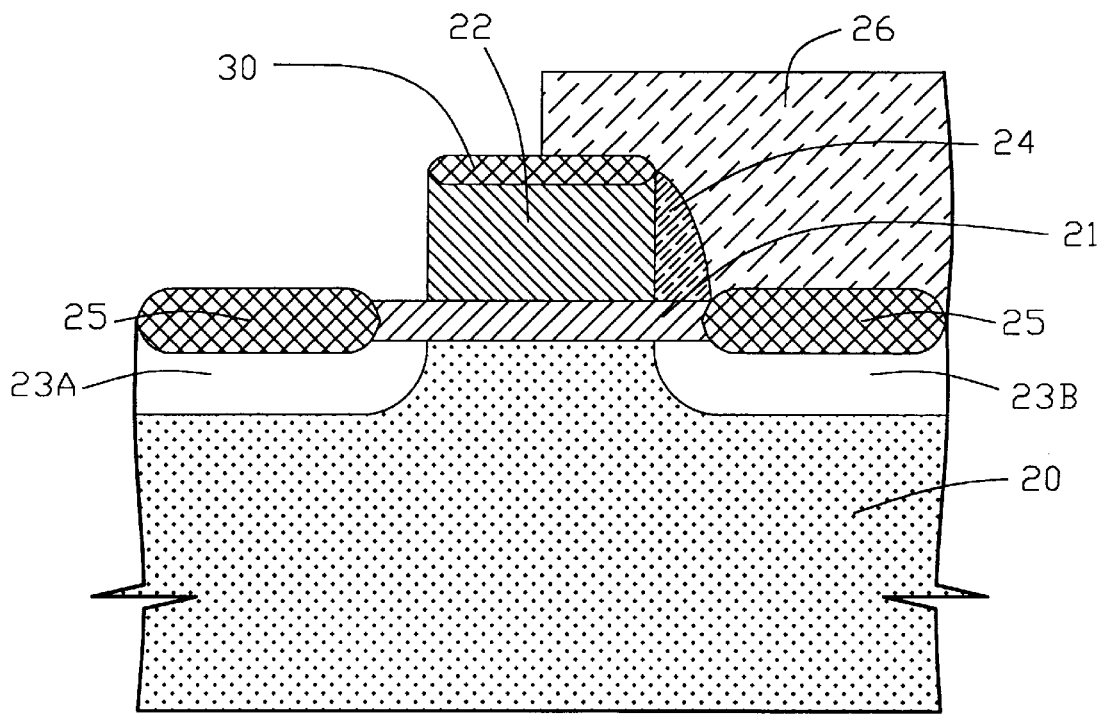

Referring to FIG. 2F, photoresist mask 26 still exists and the half of spacer 24 is not covered by the mask using conventional etching. This conventional etching is applied by $H_3PO_4$ solution dipping on the estimated portion of silicon nitride 24. Thus, the half of space 24 can be easily removed.

Figure 2G:
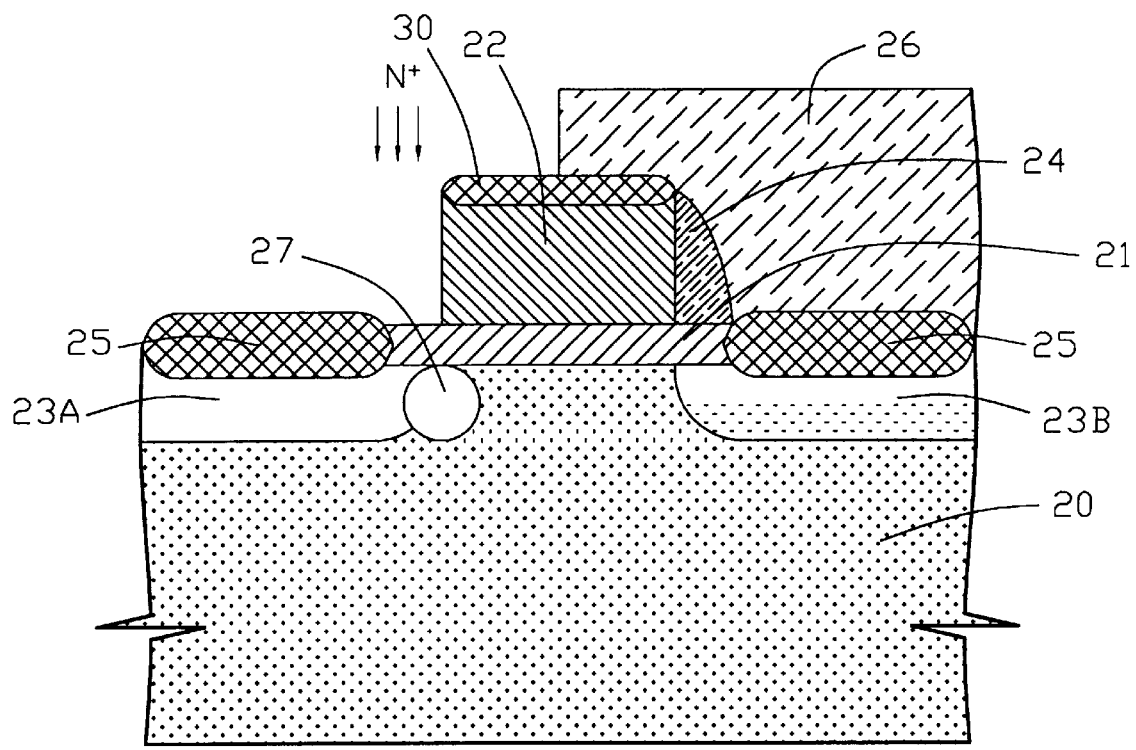

Shown as FIG. 2G, the evacuated area 27 of removed gate contact is treated by implantation after removing the half of spacer 24. Thus, gate contact can be formed in the substrate by using the salicide as an implanting mask. Generally, the conditions of implantation for NMOS are the following. Here, the implantation ion is for the N⁻ type, the diffusion energy is controlled at 1E 18, the implantation area is about 0.1 μm and all the process is without VT implantation. Also, rapid heat processing is carried again. The condition for rapid heat processing is controlled at 700° C. to 1000° C., time is about 15 seconds. There will be a small implantation zone covering the portion of original source/drain, below oxide layer 21.

Especially, a wide variety of substrate structures have been proposed to suppress the threshold voltage lowering and to achieve high current driving capability. In such structures, the parasitic junction capacitance is increased by high bulk doping concentrations due to the highly doped well, deep punch-through stop profiles, or deep pocket profiles. The heavy capacitance can strongly degrade the circuit performance.

It is briefly described in the preferred embodiment that a semiconductor substrate and a silicon dioxide layer are provided upon the semiconductor substrate. Then, a polysilicon layer is formed upon the oxide layer. Next, defining and etching the polysilicon layer are carried out to form a gate. Implanting upon the top surface of the silicon dioxide layer are achieved so that a source/drain region is formed below and abuts the silicon dioxide layer. The source/drain region will be annealed. A spacer can be formed and abuts the sidewall of the gate. A salicide is formed and overlaps the top surface of the gate and over the semiconductor substrate. Then, a gate contact area can be defined upon the top surface of the semiconductor substrate by using a mask that has a pattern covering approximately the half of the gate and the spacer. The half of the spacer can be removed without being covered by the mask. Finally, implantation will be completed to form gate contact in the substrate by using the salicide as an implanting mask.

Although specific embodiments have been illustrated and described, it will be obvious to those skilled in the art that various modifications may be made without departing from what is intended to be limited solely by the appended claims.

What is claimed is:

1. A method for forming a gate contact in metal oxide semiconductor, comprising:

providing a semiconductor substrate and an oxide layer upon said semiconductor substrate;

forming a polysilicon layer upon said oxide layer;

defining and etching said polysilicon layer to form a gate;

implanting upon top surface of said oxide layer so that source/drain region is formed below and abutted said oxide layer;

annealing said source/drain region;

forming a spacer abutting sidewall of said gate;

forming and overlapping a salicide upon top surface of said gate and over said semiconductor substrate;

defining a gate contact area upon top surface of said semiconductor substrate by using a mask which has a pattern covering approximately over half of the gate, half of the spacer and over the drain region, wherein the dimension of overlap distance for over half of the gate, half of the spacer and over the drain region being about 0.16 μm, wherein said mask is a photoresist;

removing the half of said spacer not covered by the mask; and implanting to form gate contact in the substrate by using the salicide as implanting mask.

2. The method according to claim 1, wherein said step of forming salicide comprises rapid heating processing.

3. The method according to claim 2, wherein temperature for said rapid heating processing is about 700° C. to 1000° C.

4. The method according to claim 2, wherein duration for said rapid heating processing is about 15 seconds.

5. The method according to claim 1, wherein said step of removing half of said spacer comprises $H_3PO_4$ dipping.

6. A method for forming a gate contact in metal oxide semiconductor, comprising:

providing a semiconductor substrate and an silicon dioxide layer upon said semiconductor substrate;

forming a polysilicon layer upon said silicon dioxide layer;

defining and etching said polysilicon layer to form a gate;

implanting upon top surface of said silicon dioxide layer so that source/drain region is formed below and abutted said oxide layer;

annealing said source/drain region;

forming a spacer abutting sidewall of said gate;

forming and overlapping a salicide upon top surface of said gate and over said semiconductor substrate;

defining a gate contact area upon top surface of said semiconductor substrate by using a mask which has a pattern covering approximately over half of the gate, half of the spacer and over the drain region, wherein dimension of overlap distance for over half of the gate, half of the spacer and over the drain region being about 0.16 μm, wherein said mask is a photoresist;

removing the half of said spacer not covered by the mask; and implanting to form gate contact in the substrate by using the salicide as implanting mask.

7. The method according to claim 6, wherein said step of forming salicide comprises rapid heating processing.

8. The method according to claim 7, wherein temperature for said rapid heating processing is about 700° C. to 1000° C.

9. The method according to claim 7, wherein duration for said rapid heating processing is abut 15 seconds.

10. The method according to claim 6, wherein said step of removing half of said spacer comprises $H_3PO_4$ dipping.

* * * * *